United States Patent
Kao

(10) Patent No.: US 10,509,514 B2
(45) Date of Patent: Dec. 17, 2019

(54) TOUCH DEVICE CAPABLE OF DETECTING TOUCH EVENTS THROUGH VIBRATION

(71) Applicant: ITE Tech. Inc., Hsinchu (TW)

(72) Inventor: Shu-Jen Kao, Hsinchu County (TW)

(73) Assignee: ITE Tech. Inc., Hsinchu (TW)

( * ) Notice: Subject to any disclaimer, the term of this patent is extended or adjusted under 35 U.S.C. 154(b) by 104 days.

(21) Appl. No.: 15/904,409

(22) Filed: Feb. 25, 2018

(65) Prior Publication Data

US 2019/0107902 A1 Apr. 11, 2019

(30) Foreign Application Priority Data

Oct. 11, 2017 (TW) ............................. 106134640 A

(51) Int. Cl.
  *G06F 3/043* (2006.01)
  *H03K 17/96* (2006.01)
(52) U.S. Cl.
  CPC ............ *G06F 3/043* (2013.01); *H03K 17/964* (2013.01); *H03K 2217/96058* (2013.01)
(58) Field of Classification Search
  CPC .................. G06F 3/043; H03K 17/964; H03K 2217/96058
  USPC .................................................. 345/170–178
  See application file for complete search history.

(56) References Cited

U.S. PATENT DOCUMENTS

| 8,325,144 | B1* | 12/2012 | Tierling | G06F 3/016 |
| | | | | 345/156 |
| 9,671,865 | B2* | 6/2017 | Modarres | G06F 3/016 |
| 2002/0177419 | A1* | 11/2002 | Hwang | H04R 11/00 |
| | | | | 455/575.1 |
| 2006/0071912 | A1 | 4/2006 | Hill | |
| 2009/0002328 | A1* | 1/2009 | Ullrich | G06F 3/016 |
| | | | | 345/173 |
| 2011/0075835 | A1* | 3/2011 | Hill | H04M 1/72563 |
| | | | | 379/418 |
| 2011/0077055 | A1* | 3/2011 | Pakula | H04M 19/04 |
| | | | | 455/567 |
| 2011/0134082 | A1* | 6/2011 | Mitsuhashi | G06F 1/1684 |
| | | | | 345/177 |
| 2011/0248916 | A1* | 10/2011 | Griffin | G06F 3/016 |
| | | | | 345/157 |

(Continued)

FOREIGN PATENT DOCUMENTS

| TW | 201608747 A | 3/2016 |
| TW | 201815067 A | 4/2018 |

*Primary Examiner* — Tony O Davis
(74) *Attorney, Agent, or Firm* — Winston Hsu

(57) ABSTRACT

A touch device includes a cover plate, a first piezoelectric element, and a second piezoelectric element. The cover plate has a first surface and a second surface. The first piezoelectric element is disposed on the second surface of the cover plate. The second piezoelectric element is adjacent to the first piezoelectric element. The method for operating the touch device includes outputting a first detection voltage signal to the first piezoelectric element to cause the first piezoelectric element to vibrate, receiving a second detection voltage signal from the second piezoelectric element, and determining that a touch event on the first surface of the cover plate has occurred when an energy level of the second detection voltage signal is lower than a predetermined value. The first detection voltage signal has a specific frequency which can cause the greatest vibration of the first piezoelectric element.

15 Claims, 4 Drawing Sheets

(56) References Cited

U.S. PATENT DOCUMENTS

| | | | |
|---|---|---|---|
| 2012/0242593 A1* | 9/2012 | Kim | G06F 3/016 345/173 |
| 2013/0002093 A1* | 1/2013 | Kim | G06F 3/016 310/324 |
| 2013/0069916 A1* | 3/2013 | Esteve | G06F 3/0436 345/177 |
| 2013/0162579 A1* | 6/2013 | Modarres | B06B 1/0629 345/173 |
| 2013/0229088 A1* | 9/2013 | Jung | G06F 3/016 310/317 |
| 2015/0005036 A1* | 1/2015 | Horii | H04M 1/0266 455/566 |
| 2015/0076967 A1* | 3/2015 | Kim | H01L 41/0471 310/364 |
| 2015/0192996 A1* | 7/2015 | Katou | G06F 3/016 345/173 |
| 2015/0326967 A1* | 11/2015 | Otani | H04R 1/028 381/114 |
| 2015/0364668 A1* | 12/2015 | Jung | H01L 41/0933 310/317 |
| 2016/0117034 A1* | 4/2016 | Day | G06F 3/0414 345/174 |
| 2016/0162113 A1 | 6/2016 | Araki | |
| 2018/0356926 A1* | 12/2018 | Park | G06F 3/016 |
| 2019/0074425 A1* | 3/2019 | Nakao | B06B 1/06 |
| 2019/0074426 A1* | 3/2019 | Nakao | B06B 1/04 |
| 2019/0081231 A1* | 3/2019 | Takeda | B06B 1/06 |
| 2019/0107902 A1* | 4/2019 | Kao | G06F 3/043 |

* cited by examiner

TOUCH DEVICE CAPABLE OF DETECTING TOUCH EVENTS THROUGH VIBRATION

BACKGROUND OF THE INVENTION

1. Field of the Invention

This invention is related to a touch device, and more particularly, is related to a touch device capable of detecting touch events through vibration.

2. Description of the Prior Art

In prior art, resistive touch devices and capacitive touch devices are two commonly seen types of touch devices. When the panels are touched, the resistive touch devices and capacitive touch devices can detect the touch events according to the resistance change and the capacitance change. However, to detect the change of resistance and the change of capacitance effectively, both resistive touch devices and capacitive touch devices must use non-metal materials for manufacturing the touch panels. Therefore, the design flexibility and the application fields are rather limited.

For example, in some fields, such as industry control or medical applications, to prevent equipment from breaking apart and causing safety concerns, concrete materials and materials with better malleability, such as metal materials, are preferred. On the contrary, the touch panels made of glass are avoided. In addition, if the surface of the touch panel is stained with water or other liquid, the capacitance and the resistance may also change, causing misjudgment of the touch device and limiting the usage.

SUMMARY OF THE INVENTION

One embodiment of the present invention discloses a touch device. The touch device includes a cover plate, a first piezoelectric element, a second piezoelectric element, and a control circuit.

The cover plate has a first surface and a second surface. The first piezoelectric element is disposed on the second surface of the cover plate, and has a first electrode and a second electrode. The first electrode and the second electrode of the first piezoelectric element are disposed on two opposite sides of the first piezoelectric element. The second piezoelectric element is disposed adjacent to the first piezoelectric element, and has a first electrode and a second electrode. The first electrode and the second electrode of the second piezoelectric element are disposed on two opposite sides of the second piezoelectric element.

The control circuit is coupled to the first piezoelectric element and the second piezoelectric element. The control circuit outputs a first detection voltage signal to the first electrode and the second electrode of the first piezoelectric element to cause vibration of the first piezoelectric element, receives a second detection voltage signal from the first electrode and the second electrode of the second piezoelectric element, and determines if a touch event on the first surface of the cover plate has occurred according to the second detection voltage signal. The first detection voltage signal has a specific frequency capable of maximizing vibration of the first piezoelectric element.

Another embodiment of the present invention discloses a method for operating a touch device. The touch device includes a cover plate, a first piezoelectric element, and a second piezoelectric element. The cover plate has a first surface and a second surface, the first piezoelectric element is disposed on the second surface of the cover plate, and the second piezoelectric element is disposed adjacent to the first piezoelectric element.

The method includes outputting a first detection voltage signal to the first piezoelectric element to vibrate the first piezoelectric element, receiving a second detection voltage signal from the second piezoelectric element, and determining if a touch event on the first surface of the cover plate has occurred when an energy level of the second detection voltage signal is lower than a predetermined value. The first detection voltage signal has a specific frequency capable of maximizing vibration of the first piezoelectric element.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
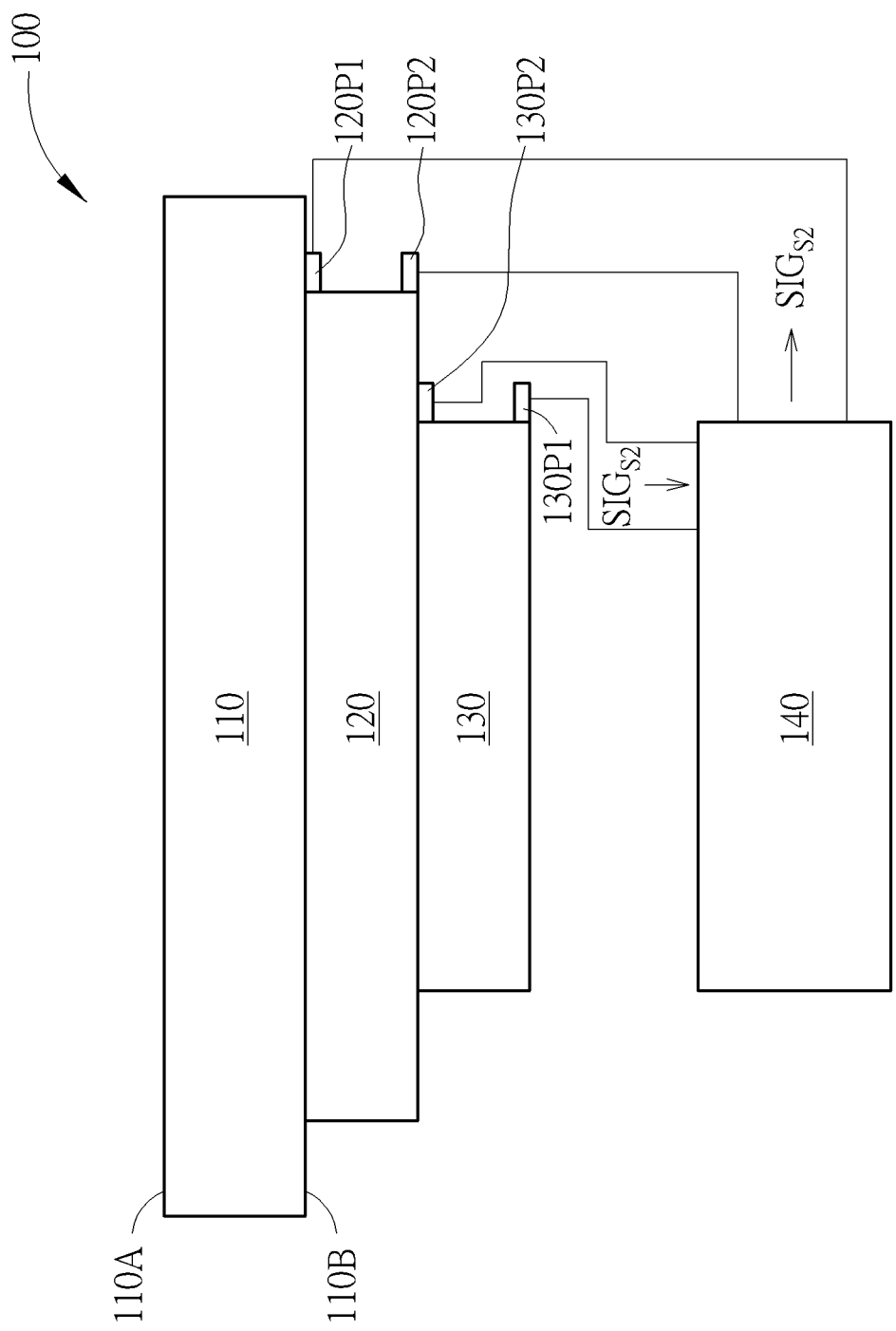
FIG. 1 shows a touch device according to one embodiment of the present invention.

FIG. 1 shows a touch device 100 according to one embodiment of the present invention. The touch device 100 includes a cover plate 110, a first piezoelectric element 120, a second piezoelectric element 130, and a control circuit 140.

The cover plate 110 has a first surface 110A and a second surface 110B. In some embodiments, the cover plate 110 can be made of, for example but not limited to, a metal material.

The first piezoelectric element 120 can be disposed on the second surface 110B of the cover plate 100, and the first piezoelectric element 120 can have a first electrode 120P1 and a second electrode 120P2. The first electrode 120P1 and the second electrode 120P2 of the first piezoelectric element 120 can be disposed on two opposite sides of the first piezoelectric element 120.

The second piezoelectric element 130 can be disposed adjacent to the first piezoelectric element 120, and the second piezoelectric element 130 can have a first electrode 130P1 and a second electrode 130P2. The first electrode 130P1 and the second electrode 130P2 of the second piezoelectric element 130 can be disposed on two opposite sides of the second piezoelectric element 130.

The control circuit 140 is coupled to the first piezoelectric element 120 and the second piezoelectric element 130. The control circuit 140 can output a first detection voltage signal $SIG_{S1}$ to the first electrode 120P1 and the second electrode 120P2 of the first piezoelectric element 120. Due to the intrinsic characteristics of the piezoelectric material, the first piezoelectric element 120 will be distorted continuously and cause vibration when receiving external alternating current power signals. In some embodiments, to prevent the vibration from being heard by human, the vibration frequency of the first piezoelectric element 120 caused by the first detection voltage signal $SIG_{S1}$ can be limited to the frequency range of ultrasound. In this case, the first piezoelectric element 120 can be seen as an ultrasonic wave source capable of generating vibrations.

Since the second piezoelectric element 130 can be disposed adjacent to the first piezoelectric element 120, the energy of the ultrasonic wave generated during the vibration of the first piezoelectric element 120 can be transmitted to the second piezoelectric element 130. In FIG. 1, the piezoelectric materials used by the first piezoelectric element 120 and the second piezoelectric element 130 can be designed to have a flat shape. In this case, the energy of the ultrasound will be transmitted mainly along the direction perpendicular to the flat plane, that is, along the direction perpendicular to the cover plate 110. Therefore, the first piezoelectric element 120 and the second piezoelectric element 130 can be stacked up while the first piezoelectric element 120 can be disposed between the second piezoelectric element 130 and the cover plate 110, so the second piezoelectric element 130 can receive most of the ultrasonic energy. However, in other embodiments, the first piezoelectric element 120 and the second piezoelectric element 130 can be disposed differently according to the usage and requirement of the touch device 100.

In addition, when the ultrasonic wave generated by the first piezoelectric device 120 is transmitted to the first surface 110A of the cover plate 110, the ultrasonic wave will be completely reflected at the interface between the cover plate 110 and air if the first surface 110A of the cover plate 110 is not covered or touched by any objects. This is because the sound resistance of the air outside of the first surface 110A of the cover plate 110 is much smaller than the sound resistance of the cover plate 110. In this case, the second piezoelectric element 130 will also receive the total reflected ultrasonic wave, and turn it into voltage signals.

However, if the first surface 110A of the cover plate 110 is covered or touched by objects, for example, touched by a user's finger, then the ultrasonic wave will be partially reflected and partially refracted at the interface between the cover plate 110 and the object outside due to the high sound resistance of the finger. Therefore, the energy of the reflected ultrasonic wave received by the second piezoelectric element 130 when the cover plate 110 is touched will be smaller than the energy received by the second piezoelectric element 130 when the cover plate 110 is not touched. Also, the voltage signals generated correspondingly would be smaller.

In other words, the intensity of the second detection voltage signal $SIG_{S2}$ generated by the second piezoelectric element 130 after receiving the ultrasonic wave generated by the first piezoelectric element 120 will be related to the existence of the touch of external objects. When the cover plate 110 is not touched or covered by external objects, the second piezoelectric element 130 would generate a greater second detection voltage signal $SIG_{S2}$. However, when the cover plate 110 is touched or covered by external objects, the second piezoelectric element 130 would generate a smaller second detection voltage signal $SIG_{S2}$.

Therefore, the control circuit 140 can receive the second detection voltage signal $SIG_{S2}$ transmitted from the first electrode 130P1 and the second electrode 130P2 of the second piezoelectric element 130, and determine if a touch event has occurred on the first surface 110A of the cover plate 110 according to the intensity of the second detection voltage signal $SIG_{S2}$.

For example, the control circuit 140 can include amplifiers and analog front end (AFE) circuits so that the second detection voltage signal $SIG_{S2}$ can be integrated and amplified. The energy level derived by processing second detection voltage signal $SIG_{S2}$ will be compared with a predetermined value. If the energy level derived is smaller than the predetermined value, then the control circuit 140 would determine that the touch event has occurred. Otherwise, the control circuit 140 would determine that the touch event has not occurred. In other embodiments, the control circuit 140 can also include different circuits to process the second detection voltage signal $SIG_{S2}$, and make the analysis and decisions according to the system requirement. That is, the present invention does not limit the way for analyzing the second detection voltage signal $SIG_{S2}$.

In some embodiments, the energy level of the second detection voltage signal $SIG_{S2}$ derived when a touch event occurs may be 90% of the energy level of the second detection voltage signal $SIG_{S2}$ derived when no touch event occurs. That is, the difference between these two levels is quite small. Therefore, if errors caused during processing become bigger, then a misjudgment may occur.

To prevent the errors from growing and affecting the accuracy of the control circuit 140, in some embodiments, the first detection voltage signal $SIG_{S1}$ generated by the control circuit 140 can have a specific frequency capable of maximizing the vibration of the first piezoelectric element 120. In this case, the control circuit 140 would be able to tolerant larger errors, and the accuracy for determining touch events can be improved.

In some embodiments, to define the specific frequency capable of maximizing the vibration of the first piezoelectric element 120, the control circuit 140 can also perform a frequency scan function, and set the first detection voltage signal $SIG_{S1}$ to have the specific frequency.

For example, the control circuit 140 can also include circuits like frequency transformers and signal combiners, so the control circuit 140 can output a series of first testing voltage signals having different frequencies to the first electrode 120P1 and the second electrode 120P2 of the first piezoelectric element 120 with the frequency transformers and the signal combiners. In this case, the first piezoelectric element 130 will generate different levels of vibrations according to the frequencies of the first testing voltage signals. According to the levels of vibration generated by the first piezoelectric element 130, the second piezoelectric element 130 will generate a series of second testing voltage signals having different energy levels accordingly. Therefore, the control circuit 140 can find the specific frequency corresponding to the second testing voltage signal having the greatest energy level according to the second testing voltage signals transmitted from the first electrode 130P1 and the second electrode 130P2 of the second piezoelectric element 130, and the control circuit 140 can set the first detection voltage signal $SIG_{S1}$ to have this frequency.

In other embodiments, the control circuit 140 may use more or less processes or even different mechanisms to derive the specific frequency according to the system requirement. The present invention does not limit the mechanism for searching for the specific frequency.

In addition, since the vibration amplitude of the first piezoelectric element 120 can be changed according to the installing environment, the control circuit 140 can perform the frequency scan function periodically to update the specific frequency of the first detection voltage signal $SIG_{S1}$ in some embodiments. Also, the predetermined value used for identifying the touch event can also be updated according to the maximum energy level received.

Furthermore, when the first surface 110A of the cover plate 110 is stained by liquid, oil sludge, or dirt, since the sound resistances of liquid, oil sludge, and dirt are different from the sound resistance of air, the energy level of the ultrasonic wave received by the second piezoelectric element 130 may also be affected. In this case, if the determination is still made by comparing the energy level with the same predetermined value, then the chances for making misjudgments will increase. To sustain the accuracy, the control circuit 140 can perform the frequency scan function to update the specific frequency and the predetermined value when the energy level of the second detection signal $SIG_{S2}$ transmitted from the first electrode 130P1 and the second electrode 130P2 of the second piezoelectric element 130 has shifted for a predetermined time. Consequently, the frequency scan function would be performed only when the environment has been changed so the power consumption can be saved while the accuracy of the touch device 100 can be sustained.

Figure 2:
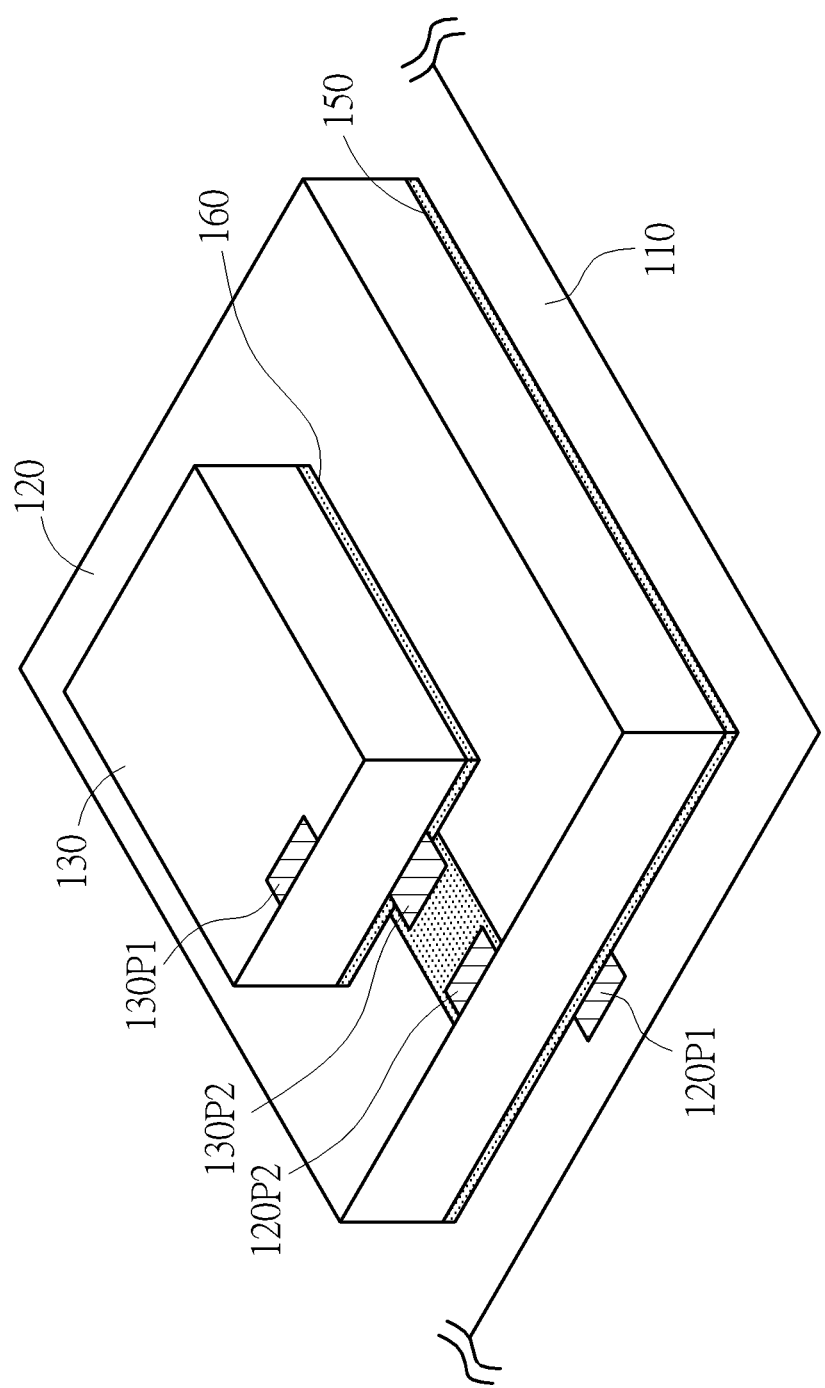
FIG. 2 shows the structure of the touch device in FIG. 1 according to one embodiment of the present invention.

FIG. 2 shows the structure of the touch device 100 according to one embodiment of the present invention. In FIG. 2, the touch device 100 can further include a first adhesive layer 150 and a second adhesive layer 160.

The first adhesive layer 150 can adhere the first piezoelectric element 120 to the second surface 110B of the cover plate 110. In some embodiments, the first adhesive layer 150 can be of an insulating material. Also, to prevent the electricity leakage on the cover plate 110, another insulation layer can be added between the first piezoelectric element 120 and the cover plate 110.

The second adhesive layer 160 can adhere the first piezoelectric element 120 and the second piezoelectric element 130. In some embodiments, the second electrode 120P2 of the first piezoelectric element 120 and the second electrode 130P2 of the second piezoelectric element 130 can both be negative signal terminals, or ground terminals. Therefore, the second electrode 130P2 of the second piezoelectric element 130 can be electrically coupled to the second electrode 120P2 of the first piezoelectric element 120. That is, the two electrodes 120P2 and 130P2 can be coupled to one single ground wire, so the internal wire connection of the touch device 100 can be simplified. In some embodiments, the second adhesive layer 160 can be conductive for electrically coupling the electrodes 120P2 and 130P2. However, in other embodiments, the electrodes 120P2 and 130P2 can also be electrically coupled through physical contact.

In addition, in FIG. 2, the cross-sectional area of the second piezoelectric element 130 can be smaller than the cross-sectional area of the first piezoelectric element 110. For example, if the cross-sectional area of the first piezoelectric element 110 is substantially equal to the button area defined on the first surface 110A of the cover plate 110, then the cross-sectional area of the second piezoelectric element 130 can be smaller than the area of the button. Consequently, it can be ensured if the energy level changes of the ultrasound wave received by the second piezoelectric element 130 is caused by the touch right on the button, avoiding misjudgments caused by energy level changes of the ultrasound wave caused by other factors. Therefore, the detection accuracy of the touch device 100 can be improved.

Figure 3:
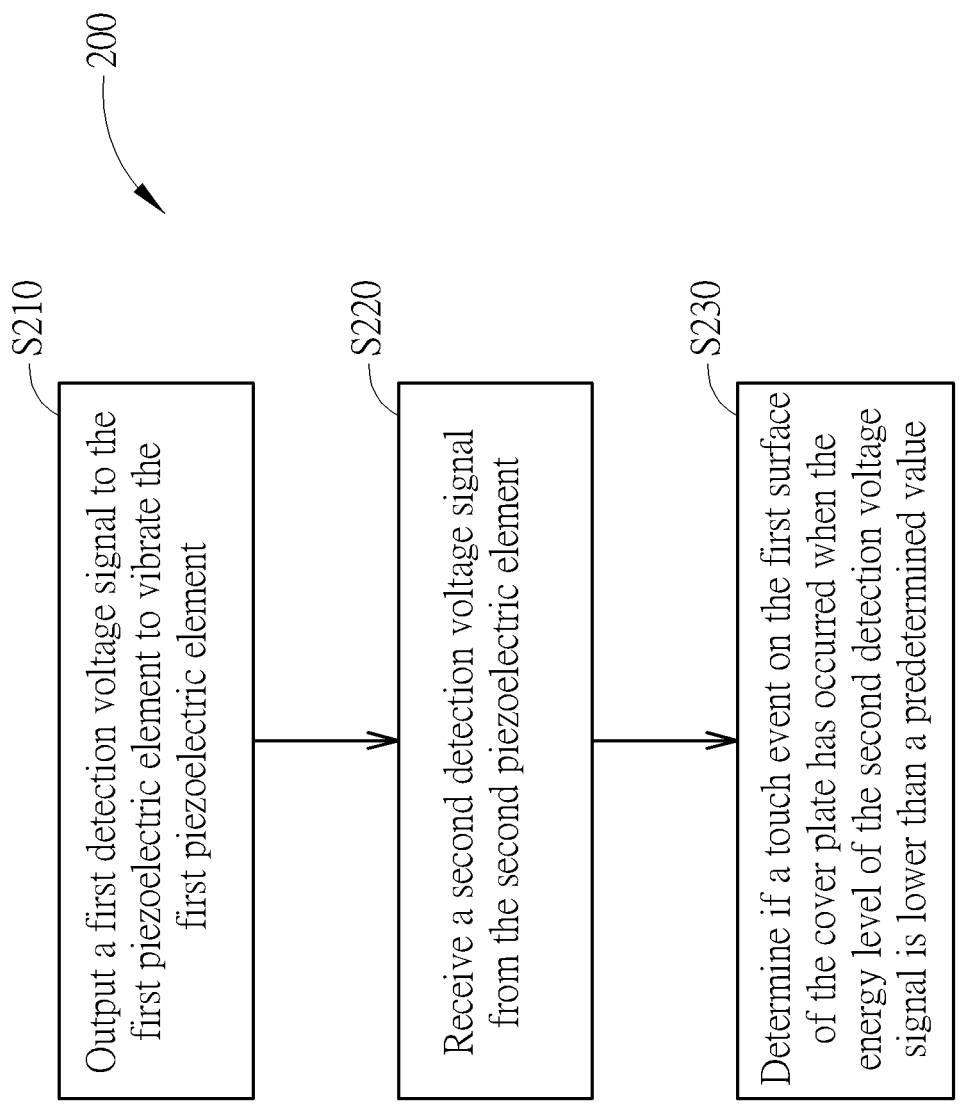
FIG. 3 shows a flow chart of the method for operating the touch device in FIG. 1 according to one embodiment of the present invention.

FIG. 3 shows a flow chart of the method 200 for operating the touch device 100 according to one embodiment of the present invention. The method 200 includes steps S210 to S230, but is not limited by the order shown in FIG. 3.

S210: output a first detection voltage signal $SIG_{S1}$ to the first piezoelectric element 120 to vibrate the first piezoelectric element 120;

S220: receive a second detection voltage signal $SIG_{S2}$ from the second piezoelectric element 130; and S230: determine if a touch event on the first surface 110A of the cover plate 110 has occurred when the energy level of the second detection voltage signal $SIG_{S2}$ is lower than a predetermined value.

Figure 4:
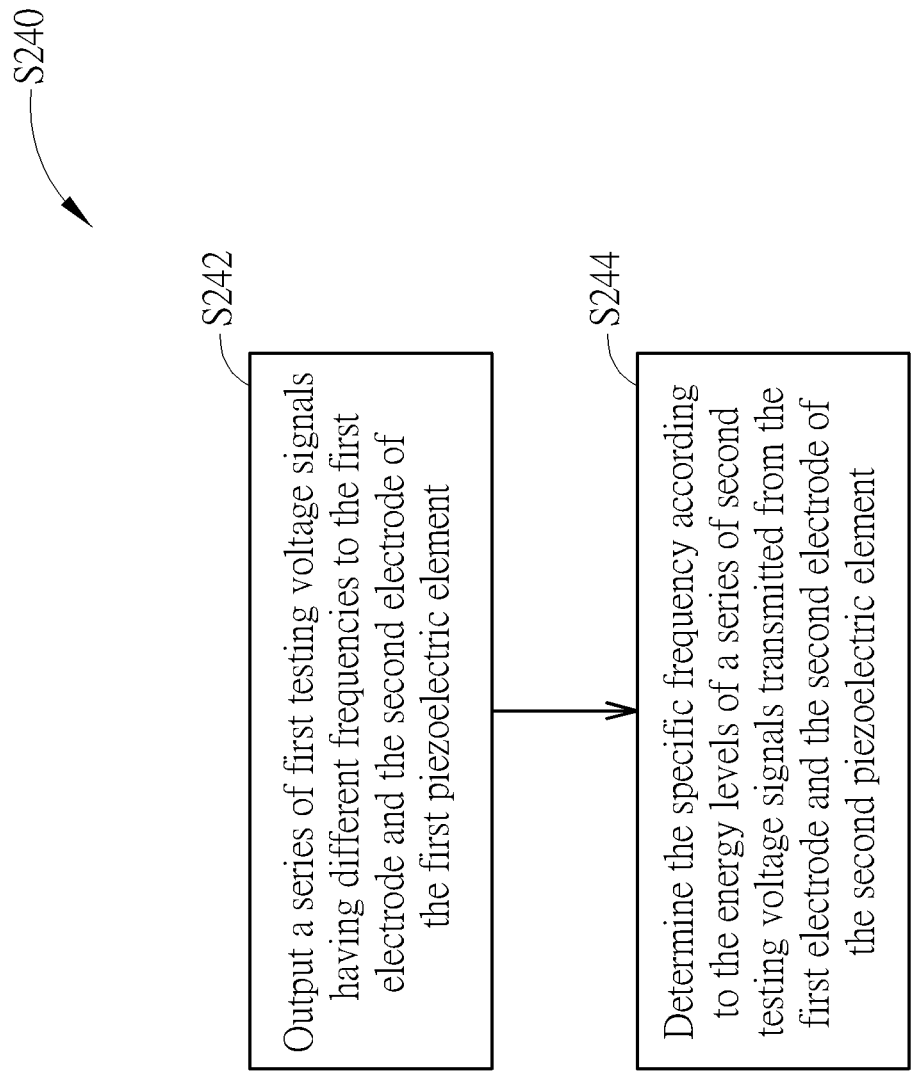
FIG. 4 shows the flow chart for performing the frequency scan function according to one embodiment of the present invention.

In addition, to ensure that the first detection voltage signal $SIG_{S1}$ can vibrate the first piezoelectric element 120 to the greatest extent, the method 200 can further include step S240 for performing the frequency scan function to set the first detection voltage signal $SIG_{S1}$ to have a required specific frequency. FIG. 4 shows the flow chart of the step S240 according to one embodiment of the present invention. The step S240 can include steps S242 and S244.

S242: output a series of first testing voltage signals having different frequencies to the first electrode 120P1 and the second electrode 120P2 of the first piezoelectric element 110;

S244: determine the specific frequency according to the energy levels of a series of second testing voltage signals transmitted from the first electrode 130P1 and the second electrode 130P2 of the second piezoelectric element 130.

Since the vibrating characteristics of the first piezoelectric element 120 can be changed by the installment environment, the method 200 may perform step S240 periodically in some embodiments. That is, the switch device 100 can perform the frequency scan function periodically to update the specific frequency of the first detection voltage signal $SIG_{S1}$. Also, the predetermined value used for identifying the touch event can also be updated according to the maximum energy level received.

In addition, to reduce unnecessary power consumption caused by performing the frequency scan function too frequently, the method 200 can also choose to perform the frequency scan function when the energy level of the second detection signal $SIG_{S2}$ transmitted from the first electrode 130P1 and the second electrode 130P2 of the second piezoelectric element 130 has shifted for a predetermined time. Consequently, the frequency for performing the frequency scan function would be reduced while the inaccuracy caused by water, oil sludge, or dirt stained on the cover plate 110 can also be prevented.

In summary, the touch devices and the methods for operating the touch devices provided by the embodiments of the present invention can generate ultrasonic wave by piezoelectric elements and determine the touch event according to the energy level of the ultrasonic wave received by the piezoelectric elements. In addition, the touch devices and the methods for operating the touch devices provided by the embodiments can also set the detection voltage signal sending to the piezoelectric elements to have a specific frequency so that the vibration of the piezoelectric elements can be maximized for identifying the touch events even more accurately.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch device comprising:
 a cover plate having a first surface and a second surface;
 a first piezoelectric element disposed on the second surface of the cover plate, and having a first electrode and a second electrode, wherein the first electrode and the second electrode of the first piezoelectric element are disposed on two opposite sides of the first piezoelectric element;

a second piezoelectric element disposed adjacent to the first piezoelectric element, and having a first electrode and a second electrode, wherein the first electrode and the second electrode of the second piezoelectric element are disposed on two opposite sides of the second piezoelectric element; and a control circuit coupled to the first piezoelectric element and the second piezoelectric element, and configured to output a first detection voltage signal to the first electrode and the second electrode of the first piezoelectric element to cause vibration of the first piezoelectric element, receive a second detection voltage signal from the first electrode and the second electrode of the second piezoelectric element, determine if a touch event on the first surface of the cover plate has occurred according to the second detection voltage signal, and perform a frequency scan function to set up a specific frequency capable of maximizing vibration of the first piezoelectric element;

wherein the first detection voltage signal has the specific frequency capable of maximizing vibration of the first piezoelectric element.

2. The touch device of claim 1, further comprising a first adhesive layer configured to adhere the first piezoelectric element to the second surface of the cover plate.

3. The touch device of claim 1, wherein the first piezoelectric element is disposed between the second piezoelectric element and the cover plate.

4. The touch device of claim 3, further comprising a second adhesive layer configured to adhere the first piezoelectric element to the second piezoelectric element.

5. The touch device of claim 4, wherein the second electrode of the second piezoelectric element is electrically coupled to the second electrode of the first piezoelectric element.

6. The touch device of claim 1, wherein a cross-sectional area of the second piezoelectric element is smaller than a cross-sectional area of the first piezoelectric element.

7. The touch device of claim 1, wherein when performing the frequency scan function, the control circuit outputs a series of first testing voltage signals having different frequencies to the first electrode and the second electrode of the first piezoelectric element, and the control circuit determines the specific frequency according to energy levels of a series of second testing voltage signals transmitted from the first electrode and the second electrode of the second piezoelectric element.

8. The touch device of claim 1, wherein the control circuit performs the frequency scan function periodically to update the specific frequency.

9. The touch device of claim 1, wherein the control circuit performs the frequency scan function when an energy level of the second detection signal transmitted from the first electrode and the second electrode of the second piezoelectric element has shifted for a predetermined time.

10. A method for operating a touch device, the touch device comprising a cover plate, a first piezoelectric element, and a second piezoelectric element, the cover plate having a first surface and a second surface, the first piezoelectric element being disposed on the second surface of the cover plate, and the second piezoelectric element being disposed adjacent to the first piezoelectric element, the method comprising:

outputting a first detection voltage signal to the first piezoelectric element to vibrate the first piezoelectric element;

receiving a second detection voltage signal from the second piezoelectric element;

determining if a touch event on the first surface of the cover plate has occurred when an energy level of the second detection voltage signal is lower than a predetermined value; and performing a frequency scan function to set up a specific frequency capable of maximizing vibration of the first piezoelectric element;

wherein the first detection voltage signal has the specific frequency capable of maximizing vibration of the first piezoelectric element.

11. The method of claim 10, wherein the first piezoelectric element is disposed between the second piezoelectric element and the cover plate.

12. The method of claim 10, wherein a cross-sectional area of the second piezoelectric element is smaller than a cross-sectional area of the first piezoelectric element.

13. The method of claim 10, wherein performing the frequency scan function to set up the specific frequency comprises:

outputting a series of first testing voltage signals having different frequencies to the first piezoelectric element; and determining the specific frequency according to energy levels of a series of second testing voltage signals transmitted from the second piezoelectric element.

14. The method of claim 10, wherein the frequency scan function is performed periodically.

15. The method of claim 10, wherein the frequency scan function is performed when an energy level of the second detection signal transmitted from the first electrode and the second electrode of the second piezoelectric element has been shifted for a predetermined time.

* * * * *